(12) United States Patent
Chishiki et al.

(10) Patent No.: US 11,928,540 B2
(45) Date of Patent: Mar. 12, 2024

(54) RFID TAG

(71) Applicant: KYOCERA Corporation, Kyoto (JP)

(72) Inventors: Ko Chishiki, Kyoto (JP); Noritaka Niino, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/605,080

(22) PCT Filed: Apr. 17, 2020

(86) PCT No.: PCT/JP2020/016867
§ 371 (c)(1),
(2) Date: Oct. 20, 2021

(87) PCT Pub. No.: WO2020/218186
PCT Pub. Date: Oct. 29, 2020

(65) Prior Publication Data
US 2022/0198238 A1  Jun. 23, 2022

(30) Foreign Application Priority Data

Apr. 24, 2019 (JP) ................................. 2019-082379

(51) Int. Cl.
*G06K 19/077* (2006.01)
*H01Q 1/22* (2006.01)
*H05K 1/02* (2006.01)

(52) U.S. Cl.
CPC ..... *G06K 19/07775* (2013.01); *H01Q 1/2208* (2013.01); *H05K 1/0243* (2013.01); *H05K 2201/10098* (2013.01)

(58) Field of Classification Search
CPC .............................................. G06K 19/07775
See application file for complete search history.

(56) References Cited

U.S. PATENT DOCUMENTS

| | | | |
|---|---|---|---|
| 2006/0220857 A1 | 10/2006 | August et al. | |
| 2008/0174436 A1* | 7/2008 | Landt ................. | G06K 19/0704 340/572.7 |
| 2014/0328507 A1* | 11/2014 | Rabel ................... | H04R 25/554 381/315 |

FOREIGN PATENT DOCUMENTS

| | | |
|---|---|---|
| JP | 2002-065418 A | 3/2002 |
| JP | 2012-248154 A | 12/2012 |
| WO | 2004/102735 A2 | 11/2004 |

* cited by examiner

*Primary Examiner* — Rafferty D Kelly
(74) *Attorney, Agent, or Firm* — Volpe Koenig

(57) ABSTRACT

An RFID tag includes a circuit board, an RFID IC and a functional module. The circuit board has an antenna conductor. The RFID IC is mounted on the circuit board. The functional module is connected to the circuit board through a lead wire. An electrical length of a connection wiring that electrically connects the functional module to an element on the circuit board is within ±10% of an integral multiple of a half wavelength of a radio signal that the RFID IC transmits or receives.

8 Claims, 5 Drawing Sheets

RFID TAG

TECHNICAL FIELD

The present disclosure relates to an RFID (Radio Frequency Identifier) tag having a functional module(s).

BACKGROUND

There is disclosed in JP 2002-65418 A an RFID tag having functional modules, such as a solar cell and a liquid crystal display device.

SUMMARY

An RFID tag according to the present invention includes:
a circuit board having an antenna conductor;
an RFID IC mounted on the circuit board; and
a functional module connected to the circuit board through a lead wire,
wherein an electrical length of a connection wiring that electrically connects the functional module to an element on the circuit board is within ±10% of an integral multiple of a half wavelength of a radio signal that the RFID IC transmits or receives.

DETAILED DESCRIPTION

Hereinafter, an embodiment of the present disclosure will be described in detail with reference to the drawings.

Figure 1:
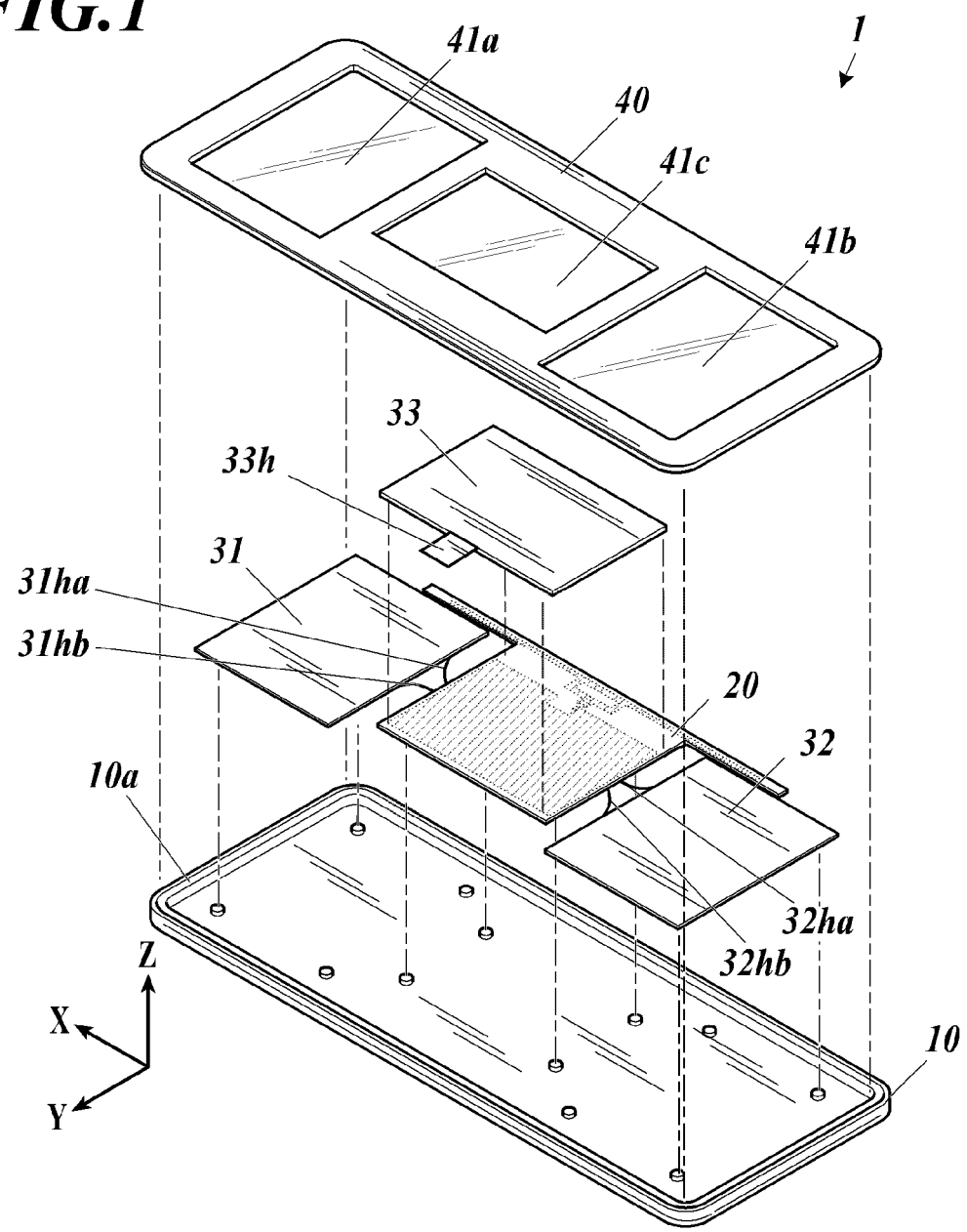
FIG. 1 is an exploded perspective view of an RFID tag according to an embodiment of the present disclosure.
Figure 2:
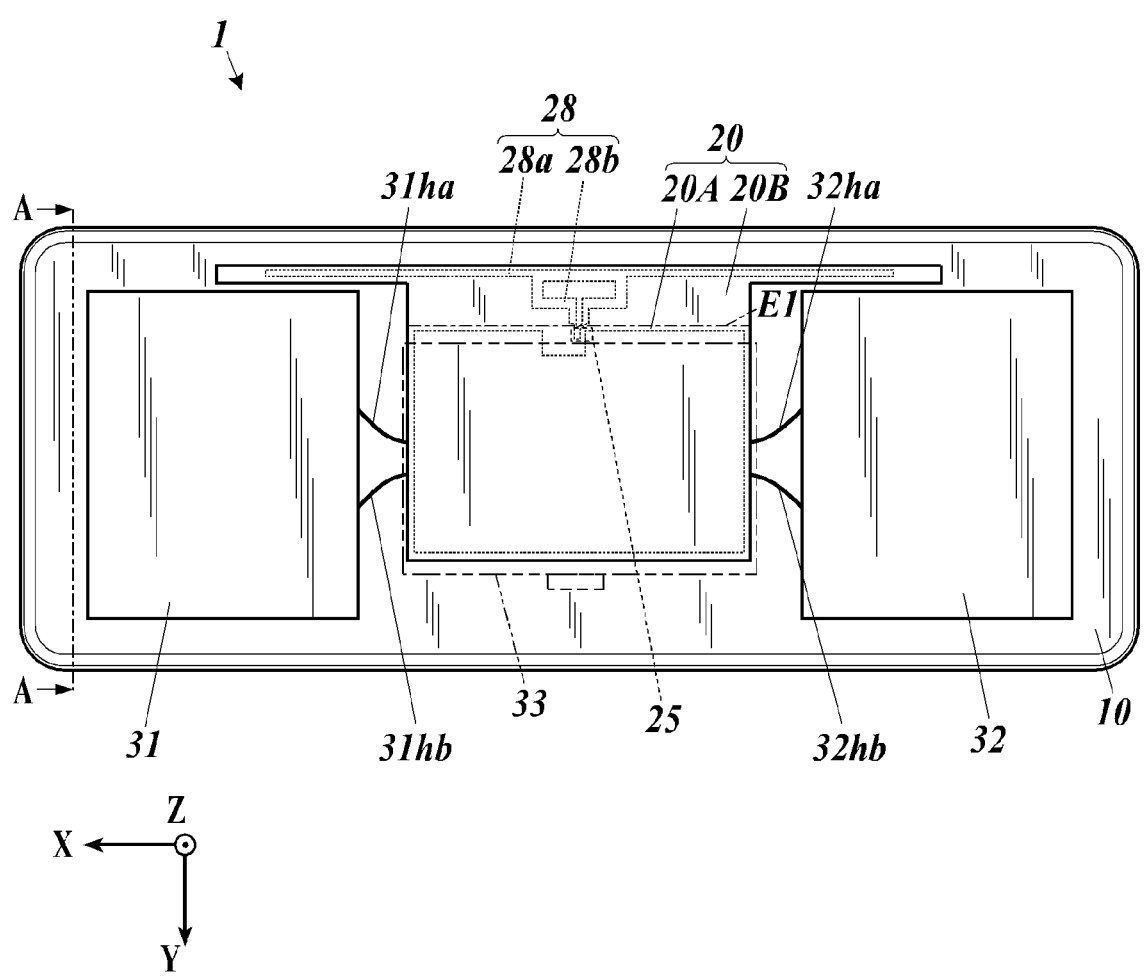
FIG. 2 is a plan view of configuration in which a circuit board and functional modules are mounted in a case.
Figure 3:
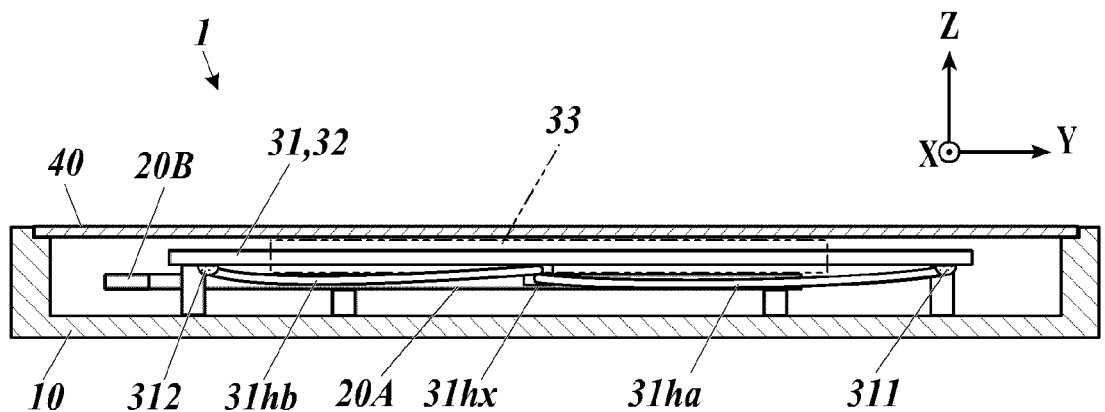
FIG. 3 is a vertical sectional view of the RFID tag of the embodiment.

FIG. 1 is an exploded perspective view of an RFID tag according to an embodiment of the present disclosure. FIG. 2 is a plan view of configuration in which a circuit board and functional modules are mounted in a case. FIG. 3 is a vertical sectional view of the RFID tag of the embodiment. In FIG. 2 and FIG. 3, a display 33 is indicated by a long dashed double-short dashed line. FIG. 3 shows a section at the position of an arrowed A-A line in FIG. 2. In this description, directions are described using directions of three axes, X, Y and Z, shown in the drawings. The X axis, Y axis and Z axis are three axes that are at right angles to one another. The X direction, Y direction and Z direction may be referred to as right-left/lateral direction, up-down direction and front-back direction, respectively. However, it is unnecessary that the directions described in this description are the same as directions of an RFID tag 1 in use.

As shown in FIG. 1, an RFID tag 1 of an embodiment includes a case 10, a circuit board 20, photovoltaic panels 31, 32 as functional modules, a display 33 and a lid 40.

The case 10 is concave with one side opened, and can accommodate the circuit board 20 and the display 33 on top of one another and the two photovoltaic panels 31, 32 on the left and right of the display 33. The case 10 is made of, as a main material, engineering plastic, such as ABS (acrylonitrile butadiene styrene resin), PC (polycarbonate), POM (polyacetal), PP (polypropylene), PPS (polyphenylene sulfite), PA (polyamide), EVA (ethylene vinyl acetate copolymer), PE (polyethylene), PBT (polybutylene terephthalate), PS (polystyrene), EP (epoxy resin) or PF (phenolic resin), and formed, for example, by injection molding. The case 10 may be formed of a mixture of any of the above materials as a main material with another material, or may be formed of such a material further containing inorganic filler.

The circuit board 20 has a main part 20A extending in the X, Y directions and an extended part 20B extending along the upper side (edge) of the main part 20A and extending long on both sides of the main part 20A in the X direction. In FIG. 2, an imaginary border line E1 between the main part 20A and the extended part 20B is shown. The main part 20A may be rectangular in plan view.

The extended part 20B includes an antenna conductor 28 and is integrated with the main part 20A. The antenna conductor 28 is formed on a surface (e.g. rear surface in FIG. 1 and FIG. 2) of the circuit board 20. An electromagnetic field that is radiated from the antenna conductor 28 is radiated in all directions in the YZ plane perpendicular to the longer direction of the antenna conductor 28 (X direction). The antenna conductor 28 may be formed on an interlayer of the circuit board 20.

The antenna conductor 28 includes a linear part 28a for radio wave radiation that resonates at the frequency of a radio signal and a pattern part 28b for impedance matching. The linear part 28a extends in the X direction to areas where the photovoltaic panels 31, 32 are arranged. The linear part 28a is longer than the lateral width of the main part 20A, and extends longer than the main part 20A in one direction and the other direction of the X direction. The linear part 28a may constitute a dipole antenna having an electrical length that is a length of about a half wavelength of a radio signal of an RFID IC 25. The pattern part 28b has, for example, a loop-shaped pattern, and is disposed between the linear part 28a and a feeding point for the RFID IC 25 and matches impedances of these.

The display 33 is, for example, a liquid crystal display panel, and electrically connected to the circuit board 20 through a wiring (e.g. a film wiring) 33h. As shown in FIG. 2, the display 33 overlaps the main part 20A of the circuit board 20 in the Z direction and does not overlap the extended part 20B thereof in the Z direction. The display 33 may overlap the pattern part 28b and the extended part 20B as long as it does not overlap the linear part 28a of the antenna conductor 28.

The photovoltaic panels 31, 32 generate electric power by receiving light from outside. Each of the photovoltaic panels 31, 32 may have a shape of a rectangular plate. The photovoltaic panels 31, 32 are electrically connected to the circuit board 20 through lead wires 31ha, 31hb, 32ha, 32hb that are coated wirings. As shown in FIG. 2, the photovoltaic panels 31, 32 are arranged, of the circuit board 20, in both armpit parts two sides of each of which are delimited by the main part 20A and the extended part 20B of the circuit board 20. As shown in FIG. 3, as viewed in a direction along the XY plane, the photovoltaic panels 31, 32 may be arranged so as to overlap the display 33 and not to overlap the circuit board 20. The lead wires 31ha, 31hb, 32ha, 32hb for the photovoltaic panels 31, 32 may be arranged so as to be covered by the photovoltaic panels 31, 32 in the Z direction except for some parts, and may be arranged at a height where they overlap the circuit board 20 as viewed in the direction along the XY plane.

The lid 40 has transparent windows 41a to 41c in areas respectively facing the photovoltaic panels 31, 32 and the display 33, and is joined to the inner frame 10a of the case 10 to seal off the case 10.

Figure 4:
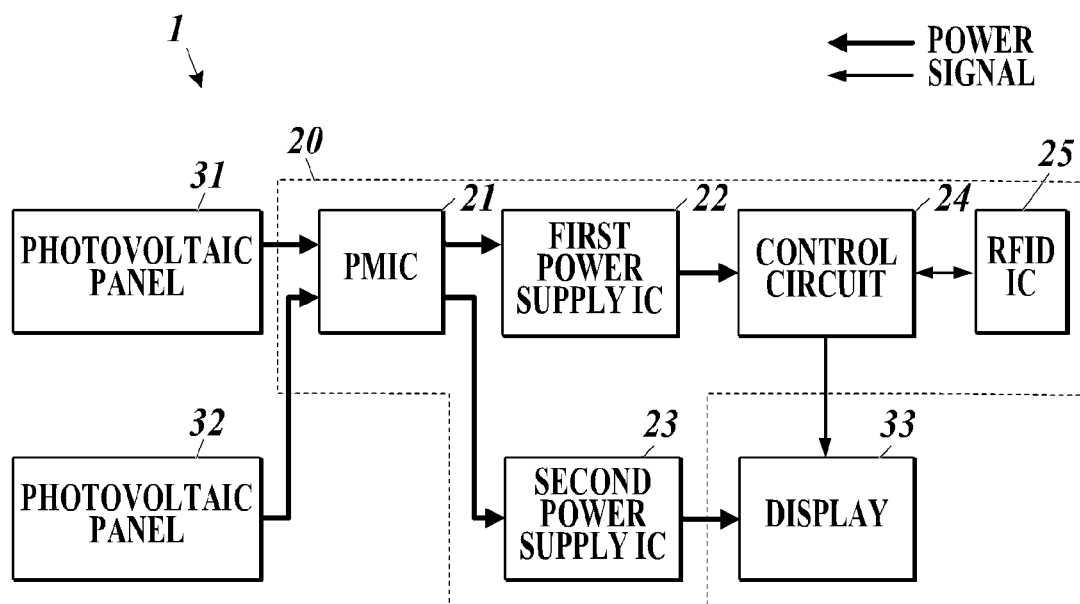
FIG. 4 is a block diagram showing circuit configuration of the RFID tag of the embodiment.

FIG. 4 is a block diagram showing circuit configuration of the RFID tag of the embodiment.

The RFID tag 1 includes a PMIC (Power Management Integrated Circuit) 21 that receives generated power from the photovoltaic panels 31, 32 and manages the power, a first power supply IC 22 that receives power from the PMIC 21 and generates a power supply voltage for a control system, and a second power supply IC 23 that receives power from the PMIC 21 and generates a drive voltage for the display 33. The RFID tag 1 also includes the RFID IC 25 that performs wireless communication with a reader/writer through radio waves and a control circuit 24 that communicates with the RFID IC 25 and controls display of the display 33. The control circuit 24 and the RFID IC 25 operate by receiving the power supply voltage from the first power supply IC 22. The RFID IC 25 performs wireless communication by using, for example, radio waves in the UHF (Ultra High Frequency) band. The RFID IC 25 includes a reader/writer readable/writable storage. In the storage, identification information, management information and/or the like is stored. The control circuit 24 is, for example, a microcomputer, and can read out the information in the storage of the RFID IC 25 by communicating with the RFID IC 25. The control circuit 24 controls display content of the display 33 on the basis of the read-out information.

Figure 5:
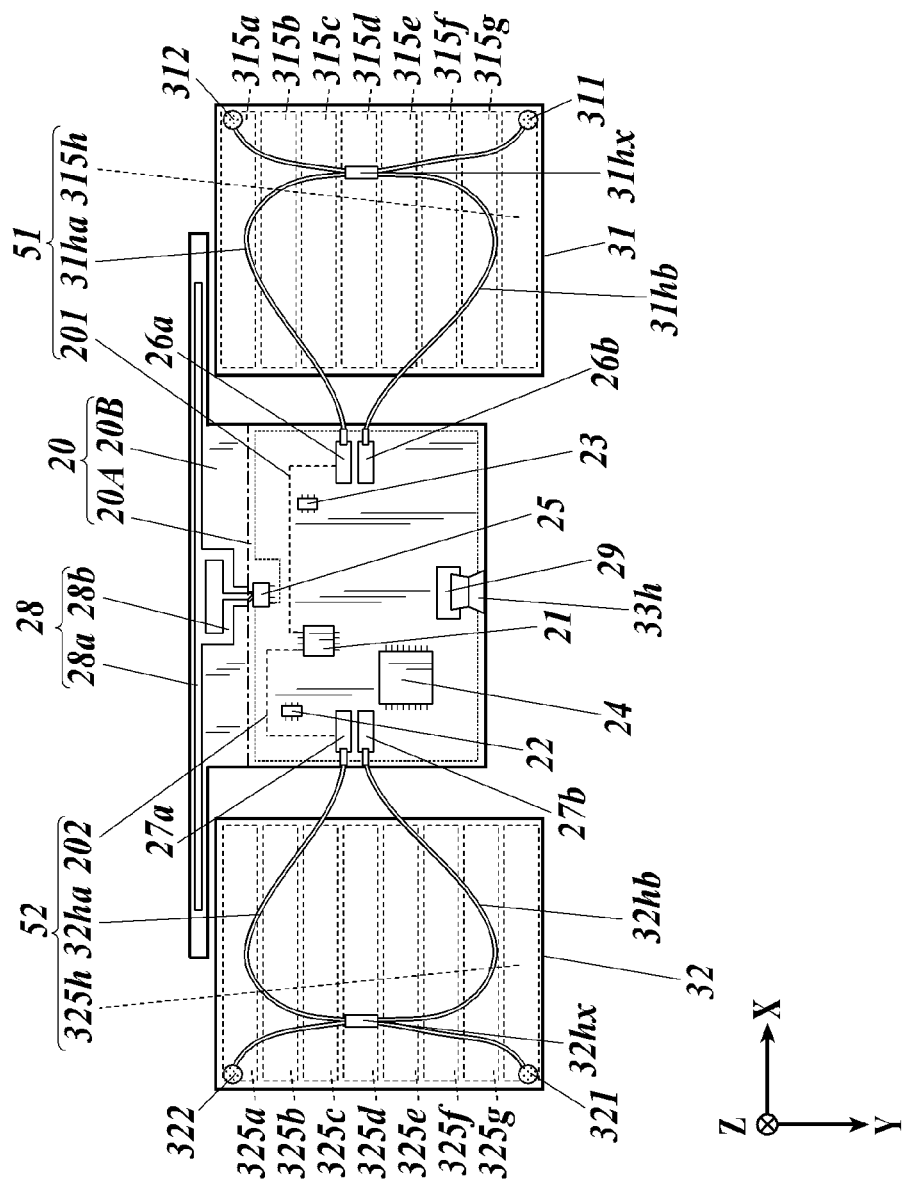
FIG. 5 is a back view of the circuit board and the functional modules.

FIG. 5 is a back view of the circuit board and the functional modules.

As shown in FIG. 5, on the main part 20A of the circuit board 20, the PMIC 21, the first power supply IC 22, the second power supply IC 23, the control circuit 24, the RFID IC 25 and so forth are mounted. Further, on the circuit board 20, a connector 29 to which the wiring 33h for the display 33 is detachably connected and connectors 26a, 26b, 27a, 27b to which the lead wires 31ha, 31hb, 32ha, 32hb are detachably connected respectively are mounted.

The photovoltaic panel 31 has, on its outer surface, two outer electrodes 311, 312 to which generated power is output. In the photovoltaic panel 31, power generation cells each configured such that a semiconductor is interposed between inner electrodes are arranged, and these power generation cells are connected in series. In FIG. 5, back-surface-side inner electrodes 315a to 315h are indicated by broken lines. The outer electrode 311 is connected to the inner electrode 315h of the power generation cell disposed at one end of this series connection, and the outer electrode 312 is connected to the inner electrode 315a of the power generation cell disposed at the other end. The outer electrode 311 and the inner electrode 315h at one end are electrically connected, without high impedance. The inner electrode 315h is connected to the other inner electrodes 315a to 315g and front-surface-side inner electrodes (transparent electrodes) through high impedance semiconductors or the like. The outer electrode 312 and the inner electrode 315a at the other end are electrically connected, without high impedance. The inner electrode 315a is connected to the other inner electrodes 315b to 315h and the front-surface-side inner electrodes (transparent electrodes) through the high impedance semiconductors or the like. These two outer electrodes 311, 312 may be arranged at two corners of the photovoltaic panel 31 in plan view (two corners that are far from the main part 20A of the circuit board 20 in the X direction and also one corner and the other corner in the Y direction).

The outer electrode 311 is connected to an element (e.g. an input terminal of the PMIC 21) on the circuit board 20 through the lead wire 31ha and a board wiring 201 on the circuit board 20. That is, the photovoltaic panel 31 and the element on the circuit board 20 are electrically connected through a connection wiring 51 into which the lead wire 31ha, a wiring conductor in the connector 26a, the board wiring 201 and the inner electrode 315h are combined. The wiring conductor in the connector 26a refers to a path part having the minimum resistance through which current flows from the lead wire 31ha to the board wiring 201. One end and the other end of the connection wiring 51 are connected to high impedance terminals, and the part between these two ends is a transmission path for low impedance power (or signal). The high impedance terminals each mean, for example, a terminal having a higher impedance than that of a connection part of the connector 26a. Herein, the impedance means a value at the radio frequency of an RFID. If a high impedance element, such as a diode, is disposed, for example, in front of the input terminal of the PMIC 21, the connection wiring 51 corresponds to a wiring of a section from an end of the inner electrode 315h of the photovoltaic panel 31 to the diode. If a capacitor is disposed, for example, in front of the input terminal of the PMIC 21, the connection wiring 51 corresponds to a wiring of a section from an end of the inner electrode 315h of the photovoltaic panel 31 to the capacitor.

The electrical length of the connection wiring 51 (inner electrode 315h, lead wire 31ha, wiring conductor in connector 26a and board wiring 201) is within ±10% of a half wavelength of a radio signal that the RFID IC 25 transmits or receives. The electrical length of the connection wiring 51 may be within ±5% of the half wavelength of the radio signal. The electrical length of the connection wiring 51 may be within ±10% or ±5% of an integral multiple of the half wavelength of the radio signal. The "within ±N % of M" means "(M−M×N %) to (M+M×N %)".

The outer electrode 312 is connected to an element (e.g. a ground terminal of the PMIC 21) on the circuit board 20 through the lead wire 31hb and a ground electrode of the circuit board 20. The ground electrode may extend on most of the main part 20A of the circuit board 20. The outer electrode 312 is electrically connected to the inner electrode 315a of the photovoltaic panel 31. The lead wire 31hb may have approximately the same length as the lead wire 31ha. The electrical length of a wiring into which the lead wire 31hb, the inner electrode 315a, a wiring conductor in the connector 26b and the ground electrode are combined may be the same as the electrical length of the connection wiring 51 described above. The length of the wiring conductor and the ground electrode refers to a path part having the minimum resistance through which current flows from the lead wire 31hb to the ground terminal of the PMIC 21.

The two lead wires 31ha, 31hb connected to the photovoltaic panel 31 are partly bound with tape or the like. The bound part is referred to as a bound part 31hx. In the example shown in FIG. 5, the two lead wires 31ha, 31hb intersect at the bound part 31hx, but may not intersect. The bound part 31hx may be fixed to the back surface of the photovoltaic panel 31. The bound form of lead wires is not limited to the form in which lead wires are bound with a single binding tool (e.g. tape), but includes the form in which lead wires are individually fixed to something other than the lead wires, thereby being kept in a state in which parts thereof are close to one another. In this case, the point where parts of lead wires are close to one another corresponds to the bound part.

The bound part 31*hx* is arranged on the opposite side of the center of the photovoltaic panel 31 from the main part 20A of the circuit board 20 (which may be referred to as the opposite side of the center of the photovoltaic panel 31 from the connectors 26*a*, 26*b*, or, of the center of the photovoltaic panel 31, the side where the outer electrodes 311, 312 are present). Further, the bound part 31*hx* is positioned, in the X direction, outward from an end of the antenna conductor 28 (which may be referred to as the opposite side of an end of the antenna conductor 28 from the central part of the antenna conductor 28). That is, the bound part 31*hx* is arranged so as not to overlap the antenna conductor 28 as viewed in the Y direction.

Similarly to the photovoltaic panel 31, the photovoltaic panel 32 has two outer electrodes 321, 322 to which generated power is output and power generation cells including back-surface-side inner electrodes 325*a* to 325*h*, and is connected to the connectors 27*a*, 27*b* on the circuit board 20 through the two lead wires 32*ha*, 32*hb*. The connection configuration of these is approximately the same as that regarding the photovoltaic panel 31 except that they are symmetrical. The electrical length of a connection wiring 52 (inner electrode 325*h*, lead wire 32*ha*, wiring conductor in connector 27*a* and board wiring 202) for the photovoltaic panel 32 is the same as the electrical length of the connection wiring 51.

The two lead wires 32*ha*, 32*hb* connected to the photovoltaic panel 32 are partly bound with tape or the like to form a bound part 32*hx*. The two lead wires 32*ha*, 32*hb* may or may not intersect at the bound part 32*hx*. The bound part 32*hx* is the same as the bound part 31*hx* except that they are symmetrical in fixation and arrangement.

<Test Results>

Figure 6:
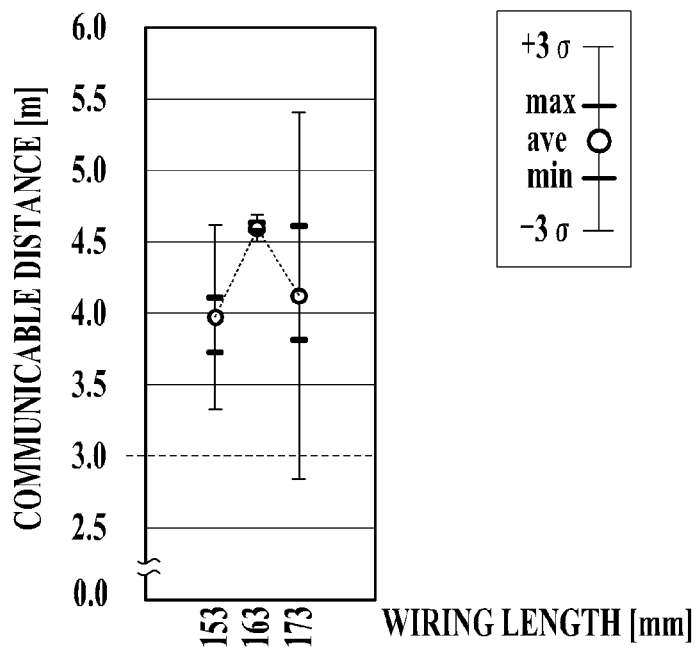
FIG. 6 is a graph showing a relationship between a wiring length and a communicable distance.

FIG. 6 is a graph showing a relationship between a wiring length and a communicable distance.

A communication test was conducted on a plurality of testing devices (RFID tags) employing connection wirings 51, 52 having a length that was different from device to device, so that results shown in FIG. 6 were obtained. As the electrical length of the connection wirings 51, 52 of the testing devices, a plurality of lengths was employed, which ranged from 153 mm to 173 mm including, at the center, 163 mm, which is the half wavelength in vacuum for 920 MHz, which is the frequency of the radio signal.

The results of the communication test are as follows: regarding the testing device having 163 mm as the electrical length, the communicable distance was long and the variance value thereof was small, and regarding each of the testing devices respectively having 153 mm and 173 mm as the electrical length, the average value of the communicable distance was low and the variance value thereof was large.

Figure 7:
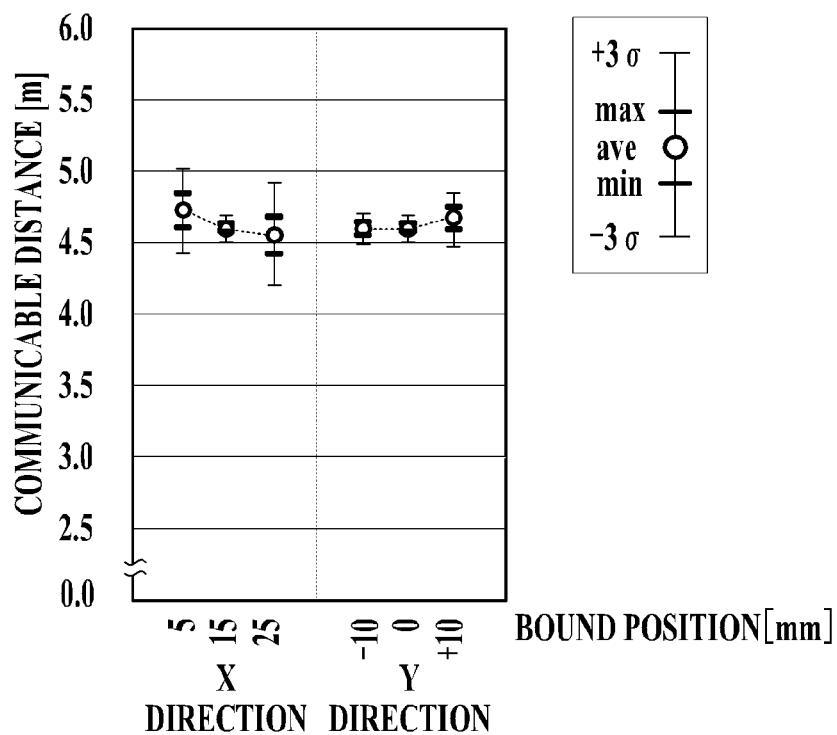
FIG. 7 is a graph showing a relationship between a bound position of lead wires and the communicable distance.

FIG. 7 is a graph showing a relationship between a bound position of lead wires and the communicable distance.

The communication test was conducted on a plurality of testing devices employing a bound part 31*hx* of lead wires 31*ha*, 31*hb* for a photovoltaic panel 31 and a bound part 32*hx* of lead wires 32*ha*, 32*hb* for a photovoltaic panel 32, wherein the positions of the bound parts 31*hx*, 32*hx* were changed in the X direction and the Y direction from device to device, so that results shown in FIG. 7 were obtained. In this test, as the position of each of the bound parts 31*hx*, 32*hx* in the X direction, a plurality of positions was employed, which ranged from 5 mm to 25 mm from an end of each of the photovoltaic panels 31, 32 (end far from the circuit board 20), and as the position thereof in the Y direction, a plurality of positions was employed, which ranged from −10 mm to +10 mm from the center of each of the photovoltaic panels 31, 32. As dimensions of the photovoltaic panels 31, 32, the X-direction dimension of 30-120 mm and the Y-direction dimension of 30-120 mm were employed. In the RFID tag 1 of the present disclosure, the dimensions of the photovoltaic panels 31, 32 are not limited thereto.

The results of the communication test are as follows: regarding the case where the bound parts 31*hx*, 32*hx* were each positioned 15 mm from the end in the X direction, the average value of the communicable distance was high and the variance thereof was small, regarding the case where the bound parts 31*hx*, 32*hx* were each positioned 5 mm from the end, the average value of the communicable distance was high but the variance thereof was large, and regarding the case where the bound parts 31*hx*, 32*hx* were each positioned 25 mm from the end, the average value of the communicable distance decreased and the variance thereof was large. The "15 mm from the end" corresponds to a position that is on the opposite side of the center of the photovoltaic panel 31/32 from the main part 20A of the circuit board 20 and where the bound part 31*hx*/32*hx* does not overlap (the linear part 28*a* of) the antenna conductor 28 as viewed in the Y direction. The "25 mm from the end" corresponds to a position that is in the vicinity of the center of the photovoltaic panel 31/32 and where the bound part 31*hx*/32*hx* overlaps (the linear part 28*a* of) the antenna conductor 28 at an end of the antenna conductor 28 as viewed in the Y direction. Regarding the positions of the bound parts 31*hx*, 32*hx* in the Y direction, in the range of −10 mm to +10 mm, no significant difference was observed in either the average value or the variance of the communicable distance.

If the inner electrodes 315*h*, 325*h* of the photovoltaic panels 31, 32 are long and/or if the board wirings 201, 202 of the circuit board 20 are long, the electrical length of the connection wirings 51, 52 can be adjusted to the half wavelength of the radio signal even if the lead wires 31*ha*, 32*ha* are short. In this case, the outer electrodes 311, 312, 321, 322 of the photovoltaic panels 31, 32 may each be arranged on a side close to the main part 20A of the circuit board 20. In the case of this configuration, if the two lead wires 31*ha*, 31*hb* are bound, the bound part 31*hx* may be arranged as described above, and similarly, if the two lead wires 32*ha*, 32*hb* are bound, the bound part 32*hx* may be arranged as described above. The two lead wires 31*ha*, 31*hb* may or may not intersect at the bound part 31*hx*, and similarly, the two lead wires 32*ha*, 32*hb* may or may not intersect at the bound part 32*hx*.

As described above, according to the RFID tag 1 of the embodiment, the electrical length of the connection wiring 51 from a point in the photovoltaic panel 31 to an element (PMIC 21) on the circuit board 20 is within ±10% of the half wavelength of the radio signal. This configuration can reduce an effect of the connection wiring 51 absorbing radio waves, which are radiated from the antenna conductor 28, and consequently can lengthen the communicable distance. The same applies to the connection wiring 52 from a point in the photovoltaic panel 32 to the element on the circuit board 20.

Further, according to the RFID tag 1 of the embodiment, the bound part 31*hx* of the lead wires 31*ha*, 31*hb* is disposed on the opposite side of the center of the photovoltaic panel 31 from the connectors 26*a*, 26*b*. The two lead wires 31*ha*, 31*hb* are present close to one another at the bound part 31*hx*, where the effect of absorbing radio waves is higher than the other parts. In the antenna conductor 28, strong electric fields are generated at the both ends of the linear part 28*a* and near the feeding point to which the RFID IC 25 is connected. The above arrangement of the bound part 31*hx* can make itself away from, of the antenna conductor 28, the feeding point where a strong electric field is generated. This can reduce the effect of the lead wires 31*ha*, 31*hb* absorbing radio waves, which are radiated from the antenna conductor 28, and consequently can lengthen the communicable distance. The same applies to the bound part 32*hx* of the lead wires 32*ha*, 32*hb* on the photovoltaic panel 32.

Further, according to the RFID tag 1 of the embodiment, in the X direction (longer direction of the antenna conductor 28), the bound part 31*hx* of the lead wires 31*ha*, 31*hb* is disposed outward from an end of the antenna conductor 28 (i.e. on the opposite side of an end of the antenna conductor 28 from the center of the antenna conductor 28). This arrangement can make the bound part 31*hx* away from, of the antenna conductor 28, an end where a strong electric field is generated. This can reduce the effect of the lead wires 31*ha*, 31*hb* absorbing radio waves, which are radiated from the antenna conductor 28, and consequently can lengthen the communicable distance. The same applies to the bound part 32*hx* of the lead wires 32*ha*, 32*hb* on the photovoltaic panel 32.

In the above, an embodiment has been described. In the above embodiment, the two photovoltaic panels 31, 32 are used as the functional modules, but, as the functional modules, various modules may be used. Examples thereof include: sensor modules that detect temperature, humidity, illuminance, oscillation, acceleration and so forth; sound collectors; and loudspeakers. The display in the embodiment may be used as a functional module, and the electrical length of a wiring thereof may be made to correspond to the half wavelength of the radio signal. The details described in the embodiment can be appropriately modified within a range not departing from the scope of the invention.

INDUSTRIAL APPLICABILITY

The present disclosure is applicable to an RFID (Radio Frequency Identifier) tag having a functional module(s).
The invention claimed is:
1. An RFID tag comprising:
a circuit board having an antenna conductor;
an RFID IC mounted on the circuit board;
at least one lead wire;
a functional module that abuts the circuit board, extends beyond the antenna conductor in a first direction and includes a bound part that is connected to the circuit board through the at least one lead wire, wherein the bound part does not overlap the antenna conductor when viewed in a second direction that is orthogonal to the first direction;
an element on the circuit board; and
a connection wiring that includes the at least one lead wire, and electrically connects the functional module to the element on the circuit board,
wherein an electrical length of the connection wiring is within ±10% of an integral multiple of a half wavelength of a radio signal that the RFID IC transmits or receives.
2. The RFID tag according to claim 1,
wherein the at least one lead wire includes a plurality of lead wires,
wherein the RFID tag further comprises, on the circuit board, a connector for the lead wires,
wherein the functional module and the connector align in the first direction, and
wherein the bound part on the functional module is disposed on an opposite side of a center of the functional module from the connector.
3. The RFID tag according to claim 1, wherein the antenna conductor includes a linear portion that extends along the first direction.
4. The RFID tag according to claim 1, wherein the functional module is a photovoltaic panel.
5. The RFID tag according to claim 4, wherein the element on the circuit board is a power management IC that receives generated power from the photovoltaic panel and manages the power.
6. An RFID tag comprising:
a circuit board having an antenna conductor;
an RFID IC mounted on the circuit board;
a photovoltaic panel that abuts the circuit board, extends beyond the antenna conductor in a first direction and includes a bound part that is connected to the circuit board through a lead wire, wherein the bound part does not overlap the antenna conductor when viewed in a second direction that is orthogonal to the first direction; and
a connection wiring that includes the lead wire, and electrically connects the photovoltaic panel to an element on the circuit board,
wherein an electrical length of the connection wiring is within ±10% of an integral multiple of a half wavelength of a radio signal that the RFID IC transmits or receives.
7. The RFID tag according to claim 6,
wherein the photovoltaic panel and a connector for the lead wire on the circuit board align in the first direction, and
wherein the bound part is disposed on an opposite side of a center of the photovoltaic panel from the connector.
8. The RFID tag according to claim 6, wherein the antenna conductor includes a linear portion that extends along the first direction.

* * * * *